US009755018B2

(12) United States Patent
Cheng et al.

(10) Patent No.: US 9,755,018 B2
(45) Date of Patent: Sep. 5, 2017

(54) BIPOLAR JUNCTION TRANSISTOR STRUCTURE FOR REDUCED CURRENT CROWDING

(75) Inventors: Lin Cheng, Chapel Hill, NC (US); Anant K. Agarwal, Chapel Hill, NC (US); Sei-Hyung Ryu, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/323,297

(22) Filed: Dec. 12, 2011

(65) Prior Publication Data

US 2013/0146894 A1 Jun. 13, 2013

(51) Int. Cl.
| | |
|---|---|
| H01L 29/06 | (2006.01) |
| H01L 29/66 | (2006.01) |
| H01L 29/732 | (2006.01) |
| H01L 29/10 | (2006.01) |
| H01L 29/16 | (2006.01) |
| H01L 29/20 | (2006.01) |

(52) U.S. Cl.
CPC ...... H01L 29/0688 (2013.01); H01L 29/1004 (2013.01); H01L 29/66068 (2013.01); H01L 29/732 (2013.01); H01L 29/1602 (2013.01); H01L 29/1608 (2013.01); H01L 29/2003 (2013.01); H01L 29/66272 (2013.01)

(58) Field of Classification Search
CPC ........... H01L 29/66068; H01L 29/7802; H01L 29/6606; H01L 29/1602; H01L 29/1608
USPC ......................................................... 257/77
See application file for complete search history.

(56) References Cited

U.S. PATENT DOCUMENTS

| | | | |
|---|---|---|---|
| 4,966,860 A | 10/1990 | Suzuki et al. | |
| 8,344,448 B2 | 1/2013 | Grover | |
| 2001/0054746 A1* | 12/2001 | Yamada | H01L 29/7317 257/565 |
| 2002/0177253 A1* | 11/2002 | Johnson | H01L 29/0821 438/91 |
| 2003/0157745 A1* | 8/2003 | Zeghbroeck et al. | 438/105 |
| 2003/0160302 A1* | 8/2003 | Sankin et al. | 257/565 |

(Continued)

OTHER PUBLICATIONS

Zhang, Jianhui et al., "Implantation-Free 4H-SiC Bipolar Junction Transistors with Double Base Epilayers", IEEE Electron Device Letters, May 1, 2008, vol. 29, No. 5, pp. 471-473, New York, New York.

(Continued)

*Primary Examiner* — Lex Malsawma
*Assistant Examiner* — Geoffrey Ida
(74) *Attorney, Agent, or Firm* — Anthony J. Josephson

(57) ABSTRACT

The present disclosure relates to a bipolar junction transistor (BJT) structure that significantly reduces current crowding while improving the current gain relative to conventional BJTs. The BJT includes a collector, a base region, and an emitter. The base region is formed over the collector and includes at least one extrinsic base region and an intrinsic base region that extends above the at least one extrinsic base region to provide a mesa. The emitter is formed over the mesa. The BJT may be formed from various material systems, such as the silicon carbide (SiC) material system. In one embodiment, the emitter is formed over the mesa such that essentially none of the emitter is formed over the extrinsic base regions. Typically, but not necessarily, the intrinsic base region is directly laterally adjacent the at least one extrinsic base region.

40 Claims, 16 Drawing Sheets

(56) References Cited

U.S. PATENT DOCUMENTS

| | | | |
|---|---|---|---|
| 2004/0012036 A1* | 1/2004 | Kotani et al. | 257/197 |
| 2005/0121696 A1* | 6/2005 | Nakazawa | H01L 29/7371 257/197 |
| 2007/0241427 A1 | 10/2007 | Mochizuki et al. | |
| 2009/0057685 A1* | 3/2009 | Mochizuki et al. | 257/77 |
| 2013/0119505 A1* | 5/2013 | Harame | H01L 29/47 257/484 |

OTHER PUBLICATIONS

International Search Report and Written Opinion for PCT/US2012/068924, mailed Mar. 20, 2013, 13 pages.
International Preliminary Report on Patentability for PCT/US2012/068924, mailed Jun. 26, 2014, 8 pages.
Office Action and Search Report for Taiwanese Patent Application No. 101147042, mailed Aug. 3, 2015, 22 pages.
Notice of Preliminary Rejection for Korean Patent Application No. 10-2014-7015775, mailed Oct. 20, 2015, 13 pages.
First Office Action and Search Report for Chinese Patent Application No. 201280061214.9, issued Mar. 18, 2016, 18 pages.
Notice of Last Preliminary Rejection for Korean Patent Application No. 10-2014-7015775, mailed Apr. 18, 2016, 6 pages.
Notice of Allowance for Taiwanese Patent Application No. 101147042, mailed Mar. 22, 2016, 5 pages.
Ghandi, R. et al., "Removal of Crystal Orientation Effects on the Current Gain of 4H-SiC BJTs Using Surface Passivation," IEEE Electron Device Letters, vol. 32, Issue 5, May 2011, IEEE, pp. 596-598.
Second Office Action for Chinese Patent Application No. 201280061214.9, mailed Nov. 28, 2016, 22 pages.
First Office Action for German Patent Application No. 11 2012 005 174.2, mailed Nov. 3, 2016, 11 pages.
Notice of Last Preliminary Rejection for Korean Patent Application No. 10-2014-7015775, mailed Oct. 21, 2016, 12 pages.
Notice of Allowance for Korean Patent Application No. 10-2014-7015775, mailed Dec. 29, 2016, 3 pages.
Third Office Action for Chinese Patent Application No. 201280061214.9, dated May 26, 2017, 10 pages.

* cited by examiner

BIPOLAR JUNCTION TRANSISTOR STRUCTURE FOR REDUCED CURRENT CROWDING

FIELD OF THE DISCLOSURE

The present disclosure relates to a bipolar junction transistor (BJT) and in particular to a BJT structure that reduces current crowding.

BACKGROUND

A bipolar junction transistor (BJT) is common type of transistor that is generally used in amplifying or switching applications. BJTs are typically three terminal transistors, which have a base, collector, and emitter. An exemplary unit cell structure for a vertically stacked NPN-type BJT 10 is illustrated in FIG. 1. As depicted, the BJT 10 includes a substrate 12, which is heavily doped with an N-type dopant (N$^+$) and formed from a portion of a semiconductor wafer 14. A collector 16, which is moderately doped with an N-type dopant (N), is formed over the substrate 12 from one or more collector layers 18. A base region 20, which is moderately doped with a P-type dopant (P), is formed over the collector 16 from one or more base layers 22. An emitter 24, which is heavily doped with an N-type dopant (N), is formed over a central portion of the base region 20 from one or more emitter layers 26.

An emitter cap 28, which is more heavily doped with an N-type dopant (N$^+$) than emitter 24, is formed over the emitter 24 from one or more emitter cap layers 30. An emitter ohmic contact 32 is formed on the emitter cap 28. The emitter cap 28 and the emitter ohmic contact 32 effectively form an electrical contact for the emitter 24, wherein the emitter ohmic contact 32 facilitates external electrical connections to the emitter cap 28, and the emitter cap 28 provides a relatively low resistance connection to the emitter 24.

The contacts for the base region 20 may be formed by selectively heavily doping outer portions of the base region 20 with a P-type dopant (P$^+$) to form base cap regions 34 within the base region 20. Base ohmic contacts 36 may be formed on the base cap regions 34 to facilitate external electrical connections with the base cap regions 34, wherein the base cap regions 34 provide relatively low resistance connections between the base region 20 and the respective base ohmic contacts 36. Alternatively, each base cap region 34 may be formed from a separate layer that resides on an upper surface of the base region 20, as opposed to being provided in the base region 20 as depicted.

A collector ohmic contact 38 may be formed on the bottom side of the heavily doped (N$^+$) substrate 12 to provide a contact for the collector 16. In essence, the collector ohmic contact 38 facilitates external electrical connection to the substrate 12, which provides a relatively low resistance connection between the collector 16 and the collector ohmic contact 38. Alternatively, the collector ohmic contact 38 may be formed on a collector cap (not shown) that is formed on the upper surface of the collector 16 or within the collector 16.

In operation, the BJT 10 allows a collector current $i_s$ to flow from the collector ohmic contact 38 to the emitter ohmic contact 32 through the base region 20 when forward biased. Being forward biased means that a positive voltage of sufficient magnitude is applied across the base ohmic contact 36 and the emitter ohmic contact 32. In addition to the collector current $i_c$ current flowing from the collector ohmic contact 38 to the emitter ohmic contact 32, a relatively small base current $i_b$ flows from the base ohmic contacts 36 to the emitter ohmic contact 32, as illustrated in FIG. 2A. The base current $i_b$ flows laterally from each of the respective base cap regions 34 inward toward the portion of the base region 20 that resides beneath the emitter 24 and then flows vertically upwards through the emitter 24 and the emitter cap 28 to the emitter ohmic contact 32. The base region 20 is somewhat resistive, and as such, the lateral flow of the base current $i_b$ through the base region 20 generates a lateral potential difference, or voltage drop, so-called self de-biasing, in the base region 20. In other words, the potential throughout the base region 20 varies, and in particular, gradually increases from a central region $R_C$, which resides under the middle portion of the emitter 24, to the respective outer regions $R_O$.

As illustrated in FIG. 2B, the lateral potential difference in the base region 20 causes a significantly uneven distribution of the collector current $i_c$ through the emitter 24 and the portion of the base region 20 that resides below the emitter 24 when the BJT is forward biased. As a result, the relatively lower potentials at or near the central region $R_C$ cause a relatively lower concentration of collector current $i_c$ to flow through the central region $R_C$ of the base region 20 and the central portion of the emitter 24. Conversely, the relatively higher potentials in the base region 20 beneath the outer portions of the emitter 24, cause relatively higher concentrations of collector current $i_c$ to flow through the outer portions of the base region 20 and emitter 24. The density of collector current $i_c$ continues to increase as the outer edges of the emitter 24 are approached. The circled portions that are labeled "A" highlight the outer areas of the base region 20 and the emitter 24 where collector current $i_c$ density is highest. The phenomenon of having significantly higher density of collector current $i_c$ near the outer areas of the base region 20 that reside beneath the emitter 24 and the outer areas of the emitter 24 is referred to as "emitter current crowding."

Current crowding is problematic in BJTs because the excessive collector current $i_c$ density in those areas that are prone to current crowding generate excessive amounts of heat. The excessive heat generation in those areas that are prone to current crowding leads to poor device performance, and in many instances, permanent damage. As such, there is a need to reduce current crowding in BJTs. There is a further need to reduce current crowding in BJTs without significantly impacting overall performance of the device.

SUMMARY

The present disclosure relates to a bipolar junction transistor (BJT) structure that significantly reduces current crowding relative to conventional BJTs while improving the current gain. The BJT includes a collector, a base region, and an emitter. The base region is formed over the collector and includes at least one extrinsic base region and an intrinsic base region that extends above the at least one extrinsic base region to provide a mesa. The emitter is formed over the mesa. The BJT may be formed from various material systems, such as the silicon carbide (SiC) material system. In one embodiment, the emitter is formed over the mesa such that essentially none of the emitter is formed over the extrinsic base regions. Typically, but not necessarily, the intrinsic base region is directly laterally adjacent the at least one extrinsic base region.

The mesa provided by the intrinsic region extends substantially above the top surface of the surrounding extrinsic regions. The intrinsic base region has a first nominal thickness, and the at least one extrinsic base region has a second nominal thickness. The thickness of the mesa is equal to the difference between the first nominal thickness of the intrinsic base region and the second nominal thickness of the extrinsic base regions and is generally at least ten percent of the first nominal thickness of the intrinsic base region.

In select embodiments, the intrinsic base region may have a graded doping concentration in the nominal direction. Alternatively it can effectively have an upper portion and a lower portion, which resides below the upper portion. The upper portion is intentionally doped with a first dopant at a first concentration, and the lower portion is intentionally doped with the first dopant at a second concentration that is intentionally different than the first dopant concentration. The first concentration in the upper portion may be higher than the second concentration in the lower portion. For example, the first concentration in the upper portion may be at least two times higher than the second concentration in the lower portion. In order to reduce the self de-biasing of the forward drop of the base-emitter voltage by reducing the resistivity of the upper portion of the extrinsic base region, the interface between the upper portion and lower portion of the intrinsic base region should be lower than the top surface of the extrinsic base region, resulting in two different dopant concentrations in the extrinsic base region.

Certain embodiments may employ a recess in a top surface of the mesa wherein the recess extends downward into the mesa. The sidewalls of the recess may be substantially vertical in some embodiments and angled relative to the epitaxial plane of the BJT in others.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region or substrate is referred to as being "on" or extending "onto" another element, it can be directly on or extend directly onto the other element or intervening elements may also be present. It should also be understood that "on" should not suggest any particular orientation. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. For example, any adjacent pair of epitaxial layers or device structures may be have intervening layers or structures residing there between, unless specifically stated otherwise.

Relative terms such as "top," "bottom," "below," "above," "upper," "lower," or "horizontal," "vertical," "lateral," and the like may be used herein to describe a relationship of one element, layer or region to another element, layer or region as illustrated in the figures. It will be understood that these terms are intended to encompass different orientations of the device in addition to the orientation depicted in the figures.

The present disclosure relates to a bipolar junction transistor (BJT) structure that significantly reduces current crowding while improving current gain relative to conventional BJTs. Current crowding in the disclosed BJTs may be reduced by 25%, 50%, and even 75% or more while current gain may be improved by 2× or more relative to conventional BJTs, depending on the specific configuration. Further, a reduction in current crowding is achieved with no negative impact on the current gain of the device.

Figure 3:
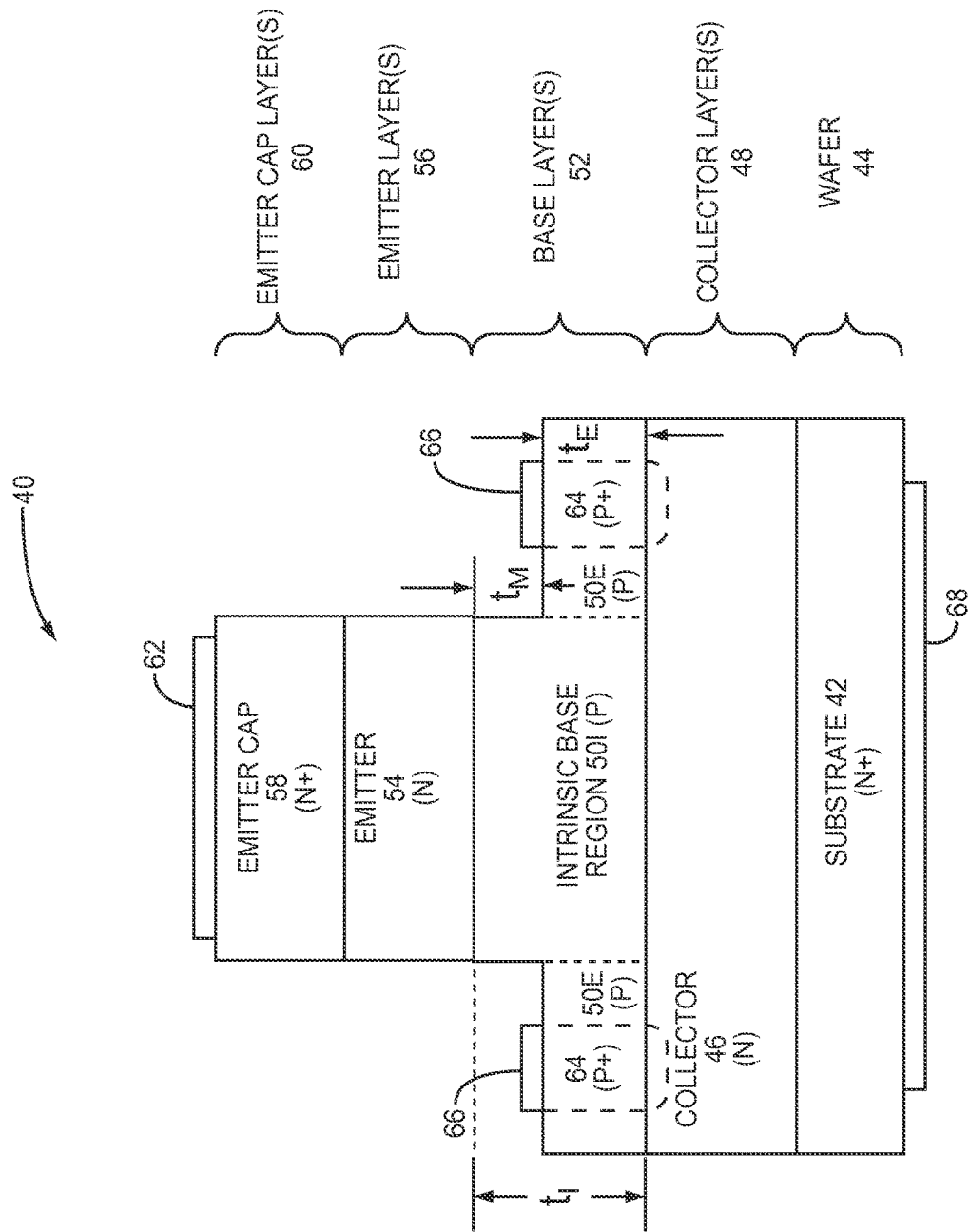
FIG. 3 is a cross section of a first embodiment of a BJT according to the disclosure.

An exemplary vertically stacked NPN-type BJT 40, which has a structure that reduces current crowding according to a first configuration, is illustrated in FIG. 3. As depicted, the BJT 40 includes a substrate 42, which is heavily doped with an N-type dopant ($N^+$) and formed from portion of a semiconductor wafer 44. A collector 46, which is moderately doped with an N-type dopant (N), is formed over the substrate 42 from one or more collector layers 48. A base region, which is moderately doped with a P-type dopant (P), is formed over the collector 46 from one or more base layers 22. For the purposes of description and clarity, the base region is shown to have an intrinsic base region 50I, which resides between two extrinsic base regions 50E. When referencing the intrinsic and extrinsic base regions 50I and 50E together, the overall base region is generally referenced as base region 50.

An emitter 54, which is heavily doped with an N-type dopant (N), is formed over the intrinsic base region 50I from one or more emitter layers 56. An emitter cap 58, which is even more heavily doped with an N-type dopant ($N^+$) than the emitter layers 54, is formed over the emitter 54 from one or more emitter cap layers 60. An emitter ohmic contact 62 is formed on the emitter cap 58. The emitter cap 58 and the emitter ohmic contact 62 effectively form a contact for the emitter 54 wherein the emitter ohmic contact 62 facilitates external electrical connections to the emitter cap 58, and the emitter cap 58 provides a relatively low resistance connection to the emitter 54.

The contacts for the base region 50 may be formed by selectively heavily doping outer portions of the extrinsic base regions 50E with a P-type dopant (P⁺) to form base cap regions 64 within the extrinsic base regions 50E. Base ohmic contacts 66 may be formed on the base cap regions 64 to facilitate external electrical connections with the base cap regions 64, wherein the base cap regions 64 provide relatively low resistance connections between the extrinsic base regions 50E and the respective base ohmic contacts 66. Alternatively, the base cap regions 64 may be formed from a separate layer that resides on an upper surface of the extrinsic base regions 50E, as opposed to being provided in the extrinsic base regions 50E as depicted.

A collector ohmic contact 68 may be formed on the bottom side of the heavily doped (N⁺) substrate 42 to provide a contact for the collector 46. In essence, the collector ohmic contact 68 facilitates external electrical connection to the substrate 12, which provides a relatively low resistance connection between the collector 46 and the collector ohmic contact 68. Alternatively, the collector ohmic contact 68 may be formed on a collector cap (not shown) that is formed on the upper surface of the collector 46 or within the collector 46.

Figure 1:
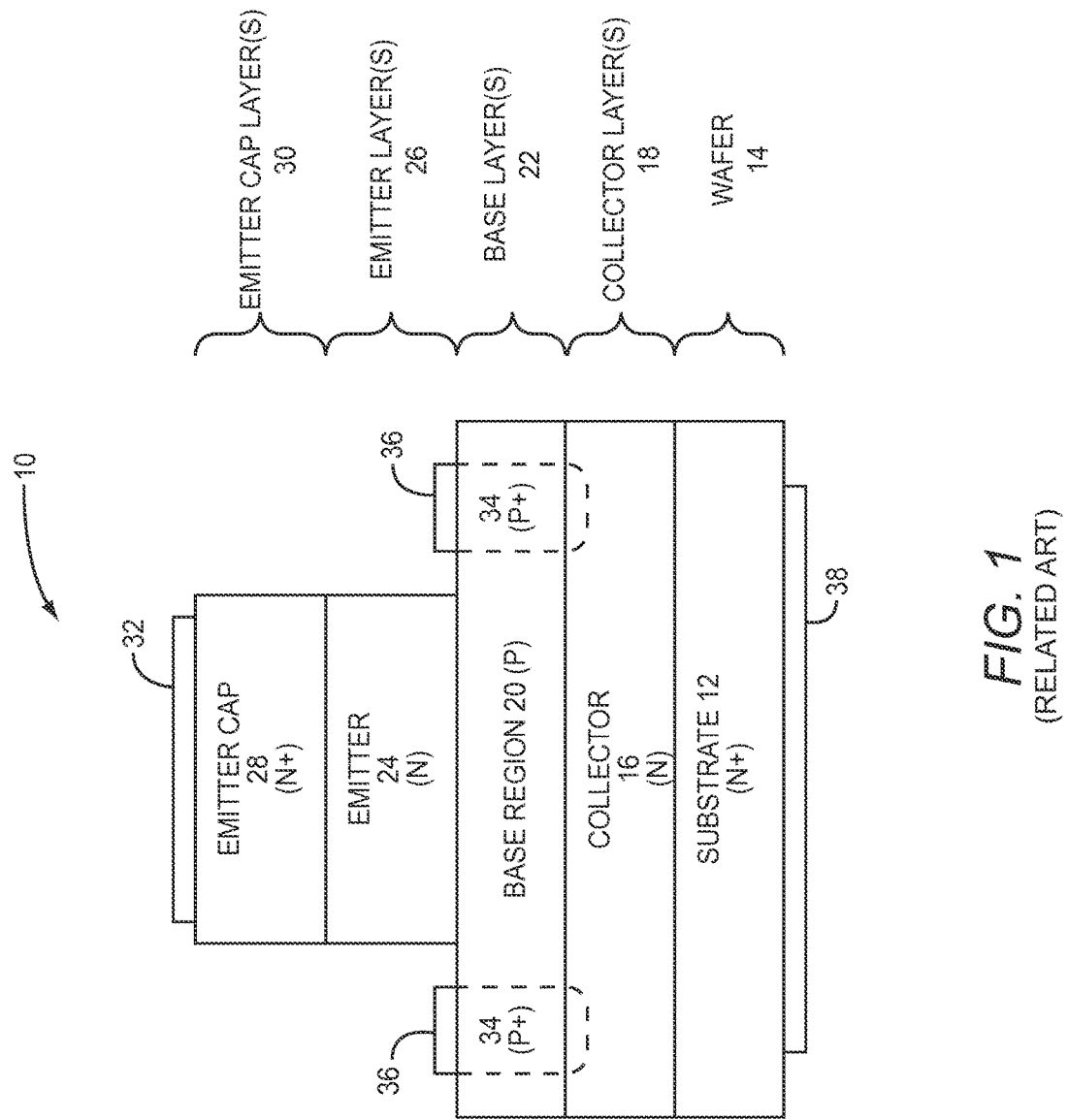
FIG. 1 is a cross-section of a conventional bipolar junction transistor (BJT).
Figure 2A:
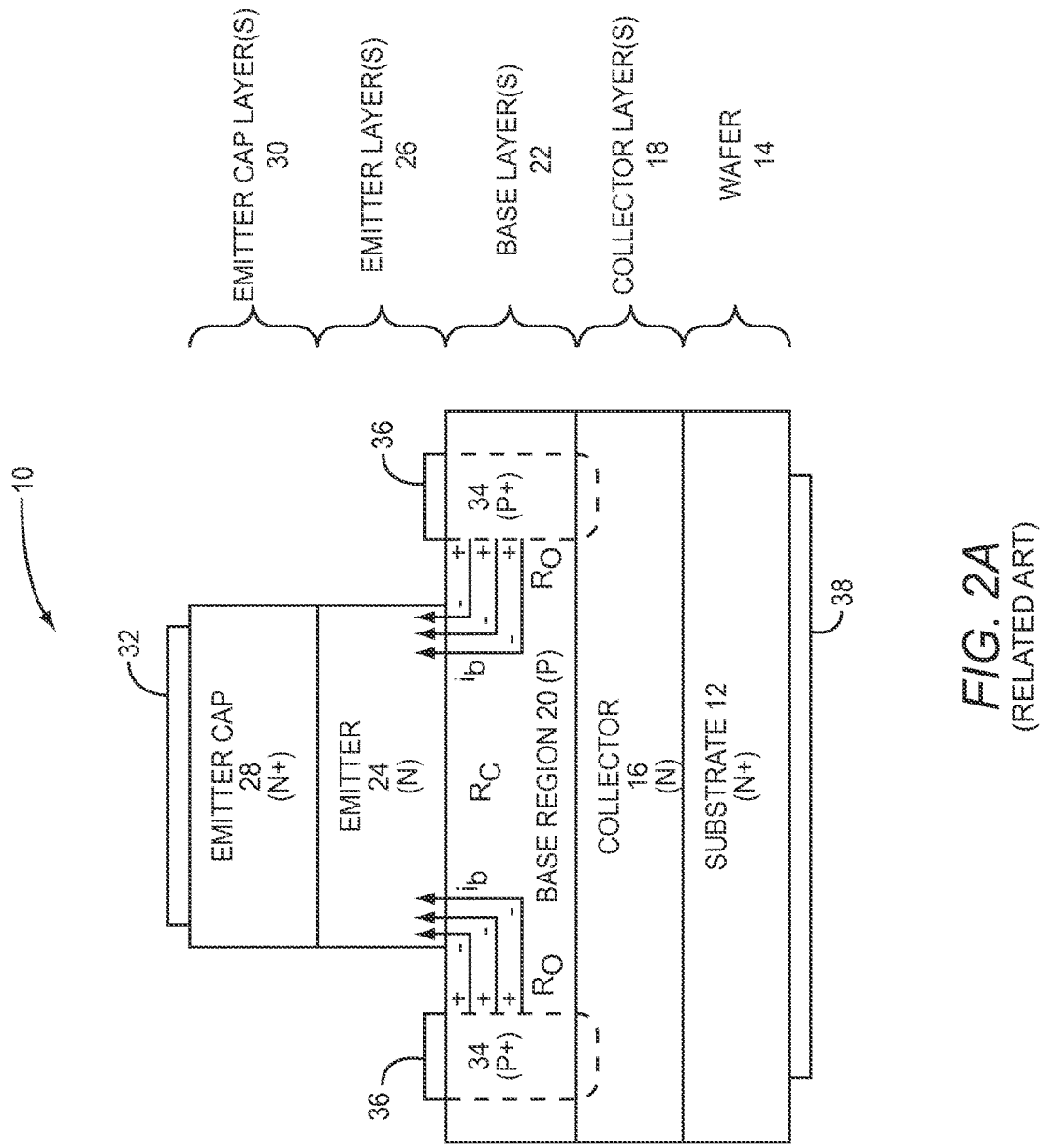
FIG. 2A illustrates laterally flowing base currents in the conventional BJT of FIG. 1 when the base-emitter is forward biased.
Figure 2B:
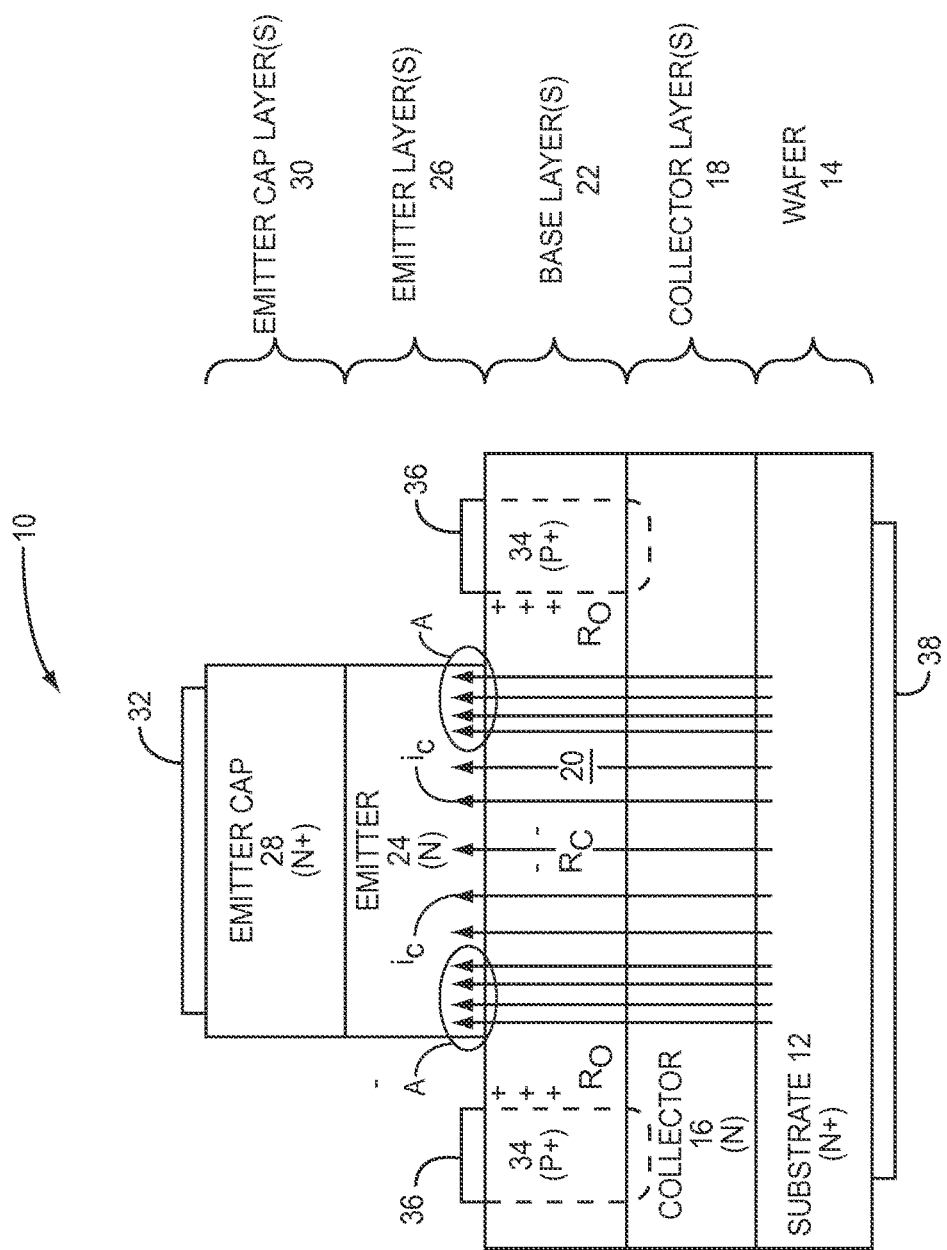
FIG. 2B illustrates current crowding in the conventional BJT of FIG. 1 when the base-emitter is forward biased.

To significantly reduce current crowding that was prevalent in the BJT 10 of FIG. 2B, the BJT 40 is fabricated such that the intrinsic base region 50I is substantially thicker than the adjacent extrinsic base regions 50E. In effect, the upper portion of the intrinsic base region 50I forms a mesa that has an upper portion that rises substantially above an upper surface of the adjacent extrinsic base regions 50E. The emitter 54 and the emitter cap 58 are formed on the mesa provided by the intrinsic base region 50I. As such, the base-emitter junction between the lower surface of the emitter 54 and the upper surface of the intrinsic base region 50I is elevated above the level of the upper surface of the extrinsic base regions 50E. In the illustrated embodiment, the lateral edges (or sides) of the emitter 54 and the emitter cap 58 substantially coincide with the lateral edges of the mesa provided by the intrinsic base region 50I. However, the relative lateral dimensions of the emitter 54, the emitter cap 58, and the mesa provided by the intrinsic base region 50I may vary with respect to one another from one embodiment to another.

The intrinsic base region 50I has an overall nominal thickness, $t_I$, the extrinsic base region 50E has an overall nominal thickness, $t_E$, and the mesa has an overall nominal thickness, $t_m$ wherein $t_m \cong t_I - t_E$. In most embodiments, the nominal thickness of the mesa, $t_m$, is greater than or equal to 10% of the nominal thickness of the intrinsic base region 50I, $t_I$, wherein $t_m \geq 0.1 \ast t_I$. In a first structure, the nominal thickness of the mesa, $t_m$, is between about 10% and 70% of the nominal thickness of the intrinsic base region 50I, $t_I$, wherein approximately $0.1 \ast t_I \leq t_m \leq 0.7 \ast t_I$. In a second structure, the nominal thickness of the mesa, $t_m$, is between about 20% and 70% of the nominal thickness of the intrinsic base region 50I, $t_I$, wherein approximately $0.2 \ast t_I \leq t_m \leq 0.7 \ast t_I$. In a third structure, the nominal thickness of the mesa, $t_m$, is between about 30% and 70% of the nominal thickness of the intrinsic base region 50I, $t_I$, wherein approximately $0.3 \ast t_I \leq t_m \leq 0.7 \ast t_I$. In a fourth structure, the nominal thickness of the mesa, $t_m$, is between about 10% and 70% of the nominal thickness of the intrinsic base region 50I, $t_I$, wherein approximately $0.2 \ast t_I \leq t_m \leq 0.7 \ast t_I$. In a fifth structure, the nominal thickness of the mesa, $t_m$, is between about 30% and 70% of the nominal thickness of the intrinsic base region 50I, $t_I$, wherein approximately $0.3 \ast t_I \leq t_m \leq 0.7 \ast t_I$. In a sixth structure, the nominal thickness of the mesa, $t_m$, is between about 40% and 70% of the nominal thickness of the intrinsic base region 50I, $t_I$, wherein approximately $0.3 \ast t_I \leq t_m \leq 0.7 \ast t_I$. In a seventh structure, the nominal thickness of the mesa, $t_m$, is about 50% of the nominal thickness of the intrinsic base region 50I, $t_I$, wherein $t_m \cong 0.5 \ast t_I$. In an eighth structure, the nominal thickness of the mesa, $t_m$, is about 70% of the nominal thickness of the intrinsic base region 50I, $t_I$, wherein $t_m \cong 0.7 \ast t_I$. In a ninth structure, the nominal thickness of the mesa, $t_m$, is between about 35% and 60% of the nominal thickness of the intrinsic base region 50I, $t_I$, wherein $0.35 \ast t_I \leq t_m \leq 0.6 \ast t_I$.

The BJT 40 of FIG. 3 may be constructed using various material systems, including silicon carbide (SiC), Gallium Nitride (GaN), Gallium Arsenide (GaAs), Silicon Germanium (SiGE), Diamond, Silicon and the like. For a SiC material system, the epitaxial structure of the BJT 40 may be, but does not necessarily need to be, configured as follows. The substrate 42 may be formed from a 4H—SiC wafer with an off-axis alignment between about 0.1° and 8° and be heavily doped with an N-type dopant (N⁺) to concentrations between about $5 \times 10^{18}$ cm⁻³ to $2 \times 10^{19}$ cm⁻³. The thickness of the substrate 42 is generally between about 10 and 650 microns.

The collector 46 is also SiC and may be moderately doped with an N-type dopant (N) to concentrations between about $2 \times 10^{14}$ cm⁻³ to $5 \times 10^{16}$ cm⁻³ in a first embodiment and between about $5 \times 10^{15}$ cm⁻³ to $1 \times 10^{16}$ cm⁻³ in a second embodiment. Depending on the desired breakdown voltage, the thickness of the collector 46 is generally between about 1 and 200 micrometers in a first embodiment and between about 5 and 10 micrometers in a second embodiment.

The base region 50, including the intrinsic and extrinsic base regions 50I and 50E as well as the base cap regions 64, is also SiC. In the first configuration of FIG. 3, the intrinsic and extrinsic base regions 50I and 50E may be moderately doped with a P-type dopant (P) to concentrations between about $1 \times 10^{17}$ cm⁻³ to $5 \times 10^{18}$ cm⁻³ in a first embodiment and between about $5 \times 10^{17}$ cm⁻³ to $5 \times 10^{18}$ cm⁻³ in a second embodiment. The thickness of the intrinsic base region 50I is generally between about 0.1 and 5 micrometers in a first embodiment and between about 0.2 and 1 micrometers in a second embodiment. The thickness of the extrinsic base region 50E is 90% or less than the thickness of the intrinsic base region 50I, as noted in greater detail above. The base contact regions 64 that reside within the extrinsic base regions 50E may be doped between $1 \times 10^{18}$ cm⁻³ to $3 \times 10^{20}$ cm⁻³. Notably, the base cap regions 64 may or may not extend into the collector 46, as illustrated in FIG. 3.

The emitter 54 is also SiC and may be heavily doped with an N-type dopant (N) to concentrations between about $1 \times 10^{18}$ cm⁻³ to $3 \times 10^{19}$ cm⁻³ in a first embodiment and between about $2 \times 10^{18}$ cm⁻³ to $2 \times 10^{19}$ cm⁻³ in a second embodiment. The thickness of the emitter 54 is generally between about 0.5 and 5 micrometers in a first embodiment and between about 0.5 and 2 micrometers in a second embodiment. The emitter cap 58 is also SiC and may be heavily doped with an N-type dopant (N+) to concentrations between about $5 \times 10^{18}$ cm⁻³ to $5 \times 10^{19}$ cm⁻³ in a first embodiment and between about $1 \times 10^{19}$ cm⁻³ to $3 \times 10^{19}$ cm⁻³ in a second embodiment. The thickness of the emitter cap 58 is generally between about 0.1 and 1 micrometers in a first embodiment and between about 0.25 and 0.5 micrometers in a second embodiment.

The emitter ohmic contact 62, base ohmic contacts 66, and the collector ohmic contact 68 may be formed from any appropriate metal or metallic composition. For example, the emitter ohmic contact 62 and the collector ohmic contact 68 may be formed from nickel (Ni) and the base ohmic contacts 66 may be formed from aluminum (Al) or aluminum nickel (AlNi) or nickel (Ni) or aluminum titanium (AlTi) when the BJT 40 is primarily formed from the SiC material system.

Figure 4:
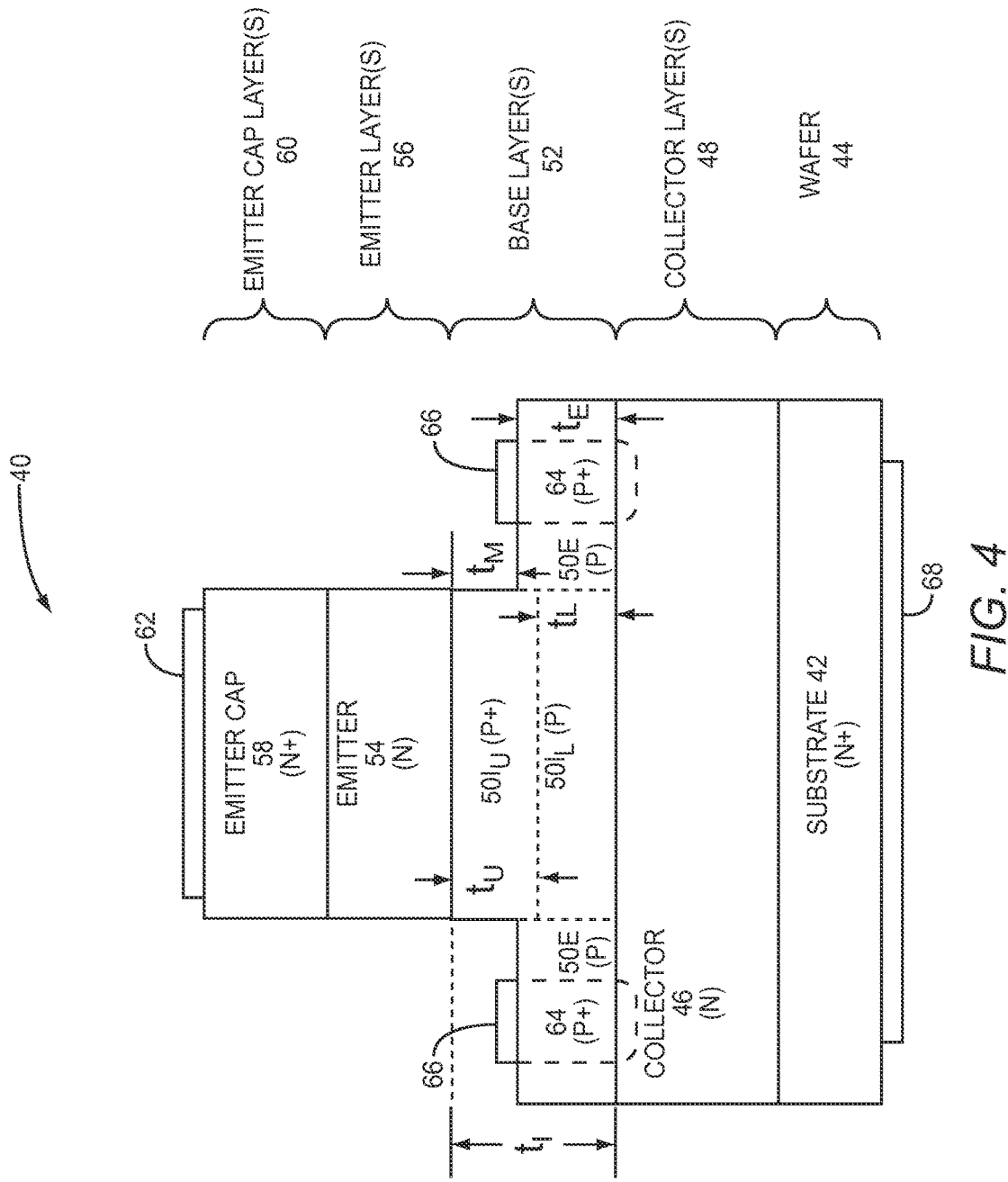
FIG. 4 is a cross section of a second embodiment of a BJT according to the disclosure.

For the configuration of the BJT 40 of FIG. 3, the base region 50, including the intrinsic base region 50I that resides beneath the emitter 54 and the extrinsic base regions 50E that reside outside of the emitter 54, is intentionally doped with a P-type dopant. In this configuration, current crowding in and around the outer portions of the emitter 54 is significantly reduced due to the reduced thickness $t_E$ of the extrinsic base regions 50E relative to the greater thickness $t_I$ of the intrinsic base region 50I. FIG. 4 illustrates a configuration of the BJT 40 that even further reduces current crowding by intentionally varying the doping within the intrinsic and extrinsic base regions 50I and 50E.

As illustrated in FIG. 4, the intrinsic base region 50I is divided into at least two regions: an upper intrinsic base region 50I$_U$ and a lower intrinsic base region 50I$_L$. The upper intrinsic base region 50I$_U$ and the lower intrinsic base region 50I$_L$ are generally, but not necessarily, formed from the same base layer or layers 52 as the extrinsic base regions 50E. The difference between the upper intrinsic base region 50I$_U$ and a lower intrinsic base region 50I$_L$ is in doping concentrations. The upper intrinsic base region 50I$_U$ is intentionally doped differently than the lower intrinsic base region 50I$_L$. In particular, the upper intrinsic base region 50I$_U$ may be doped to have significantly higher doping concentrations than the lower intrinsic base region 50I$_L$. The upper intrinsic base region 50I$_U$ may be doped to have doping concentrations that are between about two (2) and ten (10) times higher than the doping concentrations of the lower intrinsic base region 50I$_L$. In one embodiment, the upper intrinsic base region 50I$_U$ has a doping concentration that is about five (5) times higher than the doping concentration of the lower intrinsic base region 50I$_L$. For example, the upper intrinsic base region 50I$_U$ may be doped with a P-type dopant to about $1\times10^{18}$ cm$^{-3}$ and the lower intrinsic base region 50I$_L$ may be doped with a P-type dopant to about $2\times10^{17}$ cm$^{-3}$.

The respective thicknesses $t_U$, $t_L$ of the upper intrinsic base region 50I$_U$ and the lower intrinsic base region 50I$_L$, respectively, may be approximately the same or may differ from one another. Further, the thickness $t_L$ of the lower intrinsic base region 50I$_L$ may be the same or significantly different than the thickness $t_E$ of the extrinsic base regions 50E and does not have to be a function of the thickness $t_E$ of the extrinsic base regions 50E. While the embodiment of FIG. 4 provides two distinct regions of doping, the doping within the intrinsic base region 50I may be graduated throughout all or most of the intrinsic base region 50I. For example, the doping concentration may substantially continuously increase from a first level near the bottom of the intrinsic base region 50I to a second level towards the top of the intrinsic base region 50I.

Figure 5:
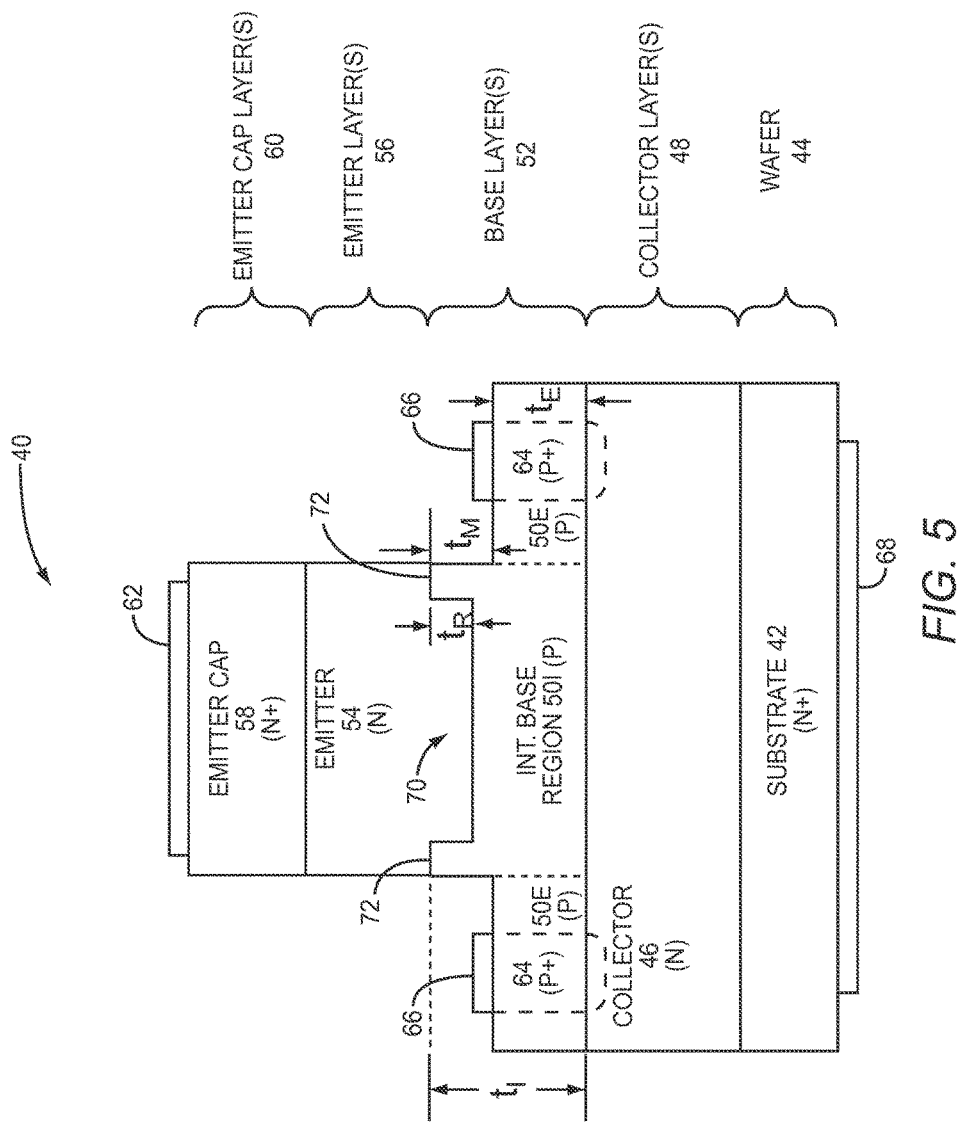
FIG. 5 is a cross section of a third embodiment of a BJT according to the disclosure.

FIG. 5 illustrates another configuration of the BJT 40. In this configuration, the intrinsic base region 50I has a recess 70 that is formed in the top surface of the intrinsic base region 50I. The recess 70 has a thickness $t_R$, which may be substantially equal to the mesa thickness $t_m$ in certain embodiments, but may also be greater than or less than the mesa thickness $t_m$ in other embodiments. For example, the thickness $t_R$ of the recess may be at least 25% of the nominal thickness $t_I$ of the intrinsic base region. The recess provides for a rim 72 to be formed about the perimeter of the upper portion of the intrinsic base region 50I. Implementing a recess 70 in the mesa provided by the intrinsic base region 50I has proven to even further reduce current crowding which greatly improves the current gain. In this configuration, the sidewalls of the recess are substantially vertical; however, those skilled in the art will recognize that most etching processes will inherently result in "vertical" edges being somewhat sloped.

Figure 6:
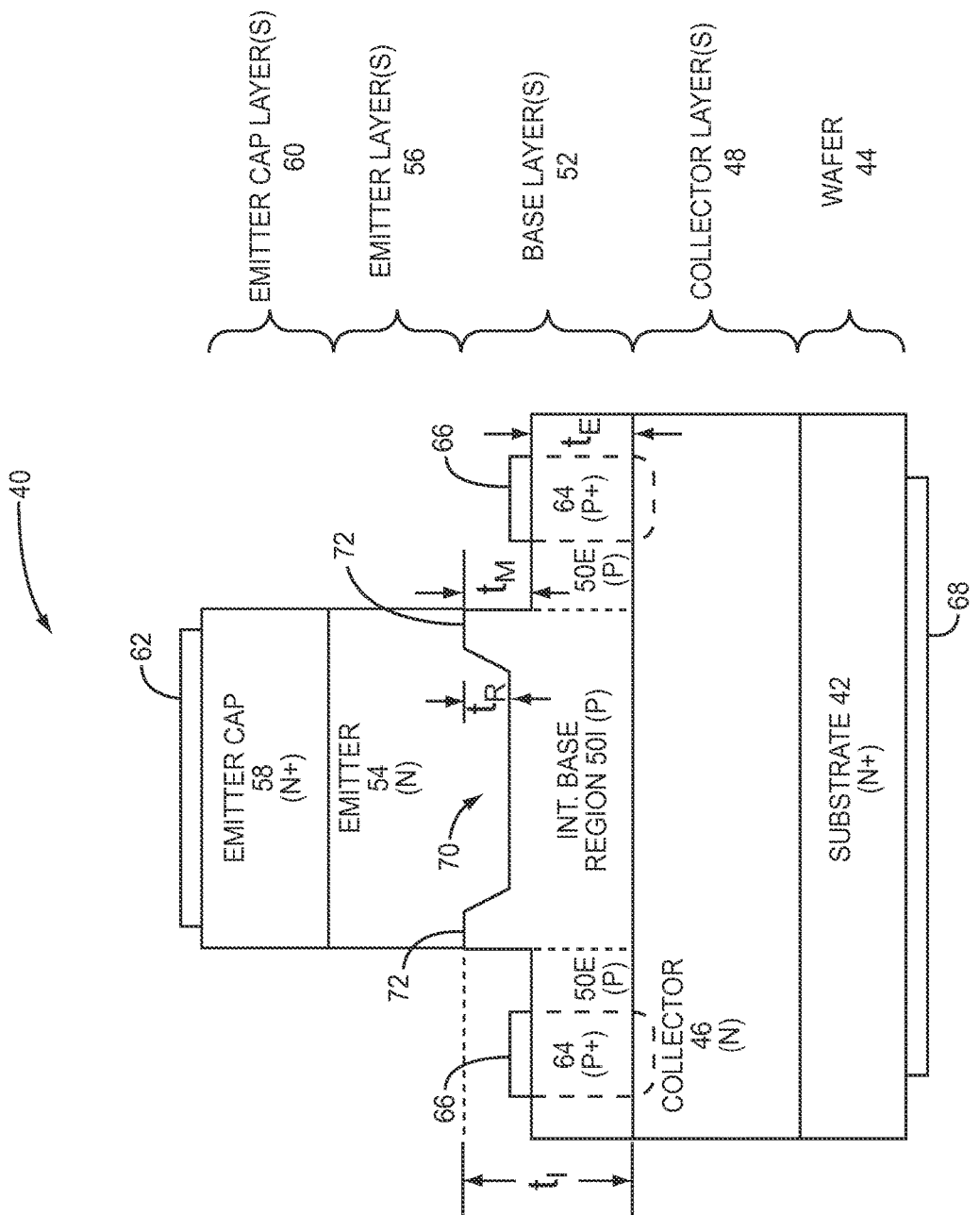
FIG. 6 is a cross section of a fourth embodiment of a BJT according to the disclosure.
Figure 7:
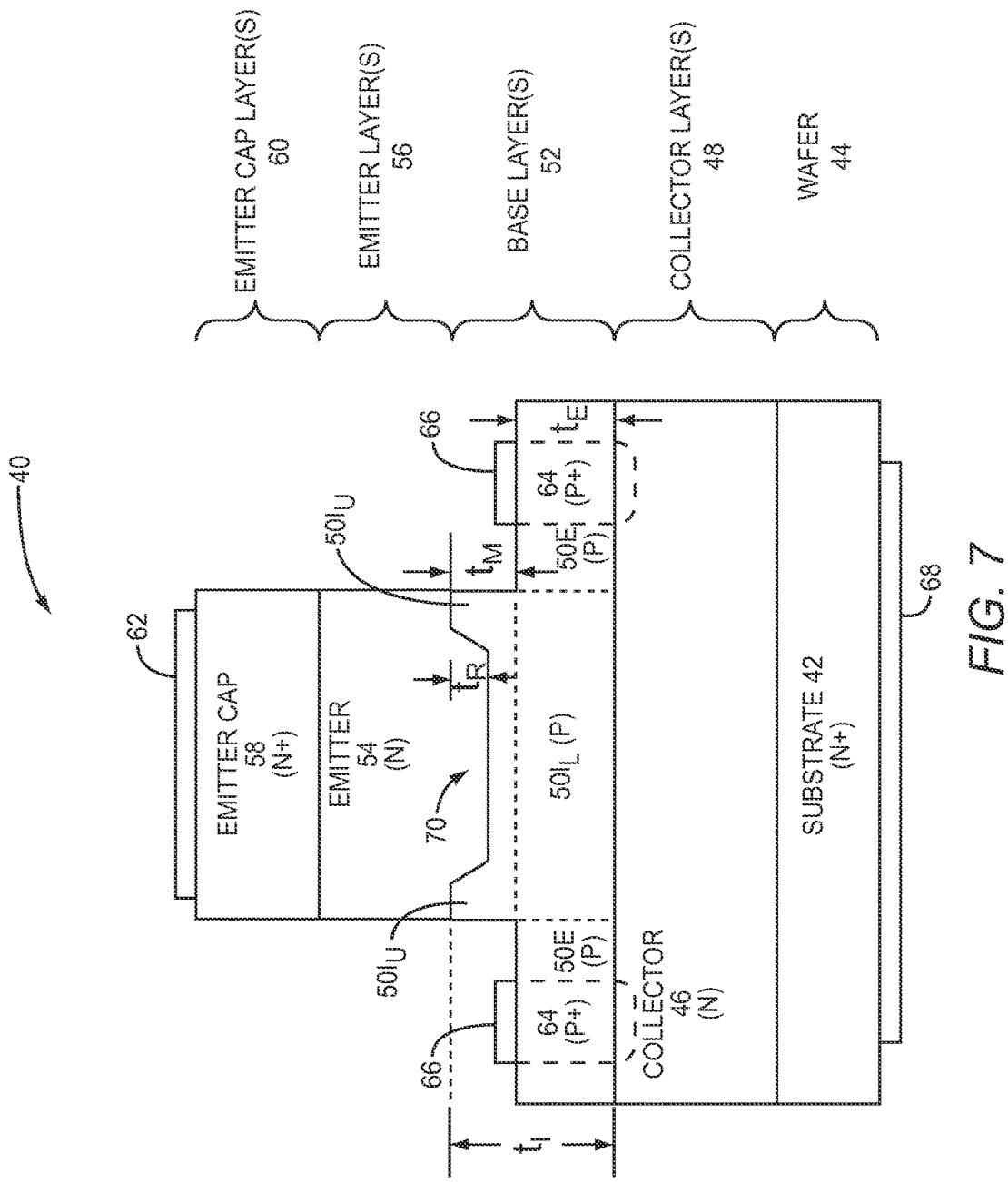
FIG. 7 is a cross section of a fifth embodiment of a BJT according to the disclosure.

In the embodiment of FIG. 6, the sidewalls of the recess are intentionally sloped. As illustrated, the sidewalls are sloped by approximately 45°, but this angle may vary anywhere from about 20° to 70°, and generally from about 30° to 60° relative to the epitaxial planes. In the embodiment of FIG. 7, the base region 50 again has the upper intrinsic base region 50I$_U$ and the lower intrinsic base region 50I$_L$. The upper intrinsic base region 50I$_U$ includes the recess 70 in its upper surface and is intentionally doped differently that the lower intrinsic base region 50I$_L$.

In the illustrated embodiment, the recess 70 does not extend to the junction between the lower intrinsic base region 50I$_L$ and the upper intrinsic base region 50I. In other embodiments, the recess 70 may extend to the junction between the lower intrinsic base region 50I$_L$ and the upper intrinsic base region 50I$_U$ or through the junction into the lower intrinsic base region 50I$_L$.

The upper intrinsic base region 50I$_U$ may be doped to have significantly higher doping concentrations than the lower intrinsic base region 50I$_L$. The upper intrinsic base region 50I$_U$ may be doped to have doping concentrations that are between about two (2) and ten (10) times higher than the doping concentrations of the lower intrinsic base region 50I$_L$. In one embodiment, the upper intrinsic base region 50I$_U$ has a doping concentration that is about five (5) times higher than the doping concentrations of the lower intrinsic base region 50I$_L$. For example, the upper intrinsic base region 50I$_U$ may be doped with a P-type dopant to about $1\times10^{18}$ cm$^{-3}$ and the lower intrinsic base region 50I$_L$ may be doped with a P-type dopant to about $2\times10^{17}$ cm$^{-3}$.

Figure 8A:
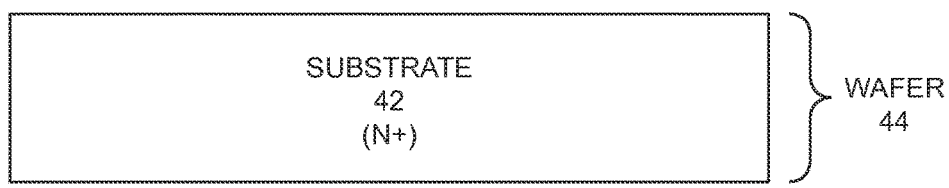
FIGS. 8A through 8I illustrate sequential steps in an exemplary process for fabricating the BJT of FIG. 6.
Figure 8B:
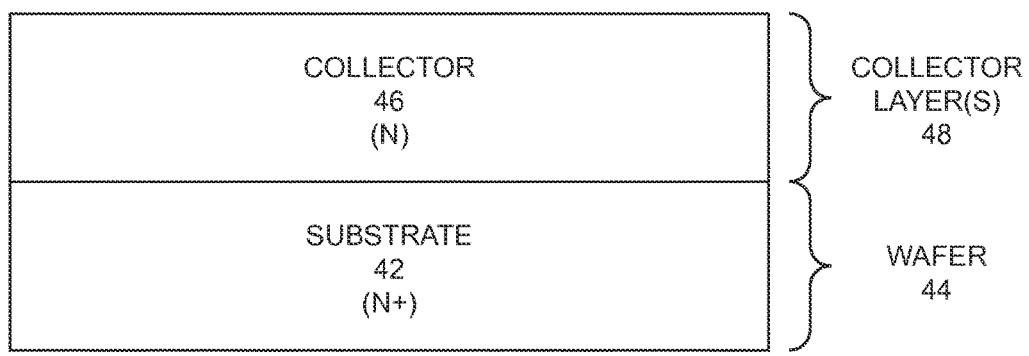
Figure 8C:
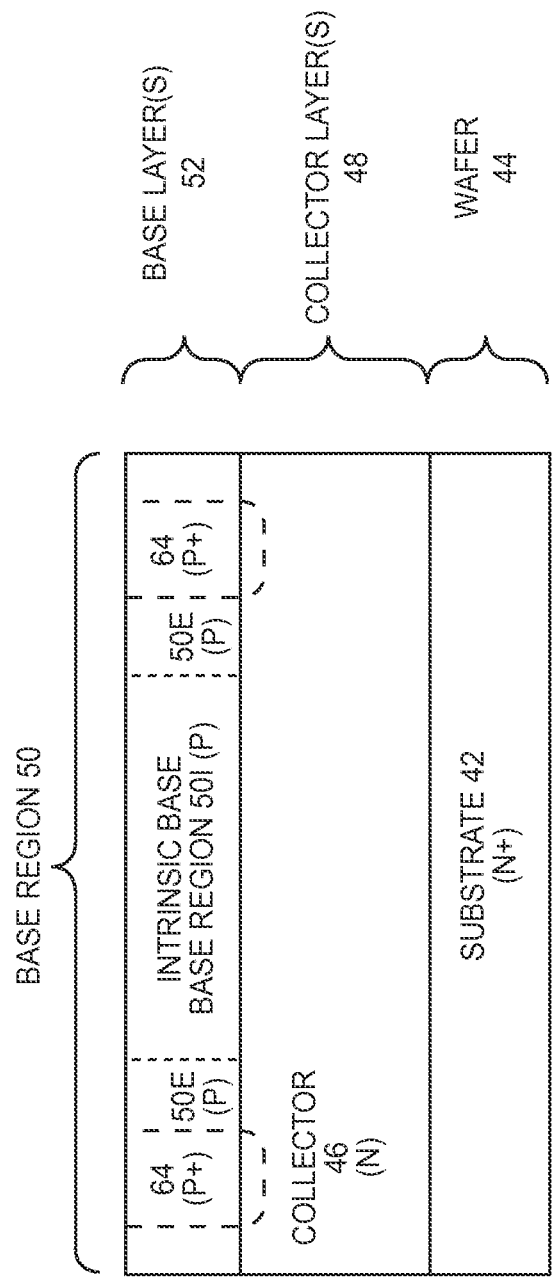

In association with FIGS. 8A through 8I, an exemplary process for fabricating the BJT 40 illustrated in FIG. 6 is described. Each of the epitaxial layers in the structure of the BJT 40 is formed though sequences of known growth or deposition processes and the use of selective etching. Initially, the substrate 42 is provided in the form of the wafer 44 and heavily doped with N-type dopant (FIG. 8A). Next, one or more collector layers 48 are formed on the upper surface of the substrate 42 and then moderately doped with an N-type dopant to provide the collector 46 (FIG. 8B). After the collector 46 is formed, one or more base layers 52 are formed on the upper surface of the collector 46. The one or more base layers 52 are moderately doped with a P-type dopant wherein what are effectively the intrinsic and extrinsic base regions 50I and 50E are similarly doped (FIG. 8C). At this time, the base cap regions 64, which reside in the extrinsic base regions 50E, may be formed by selectively heavily doping these areas with a P-type dopant.

Figure 8D:
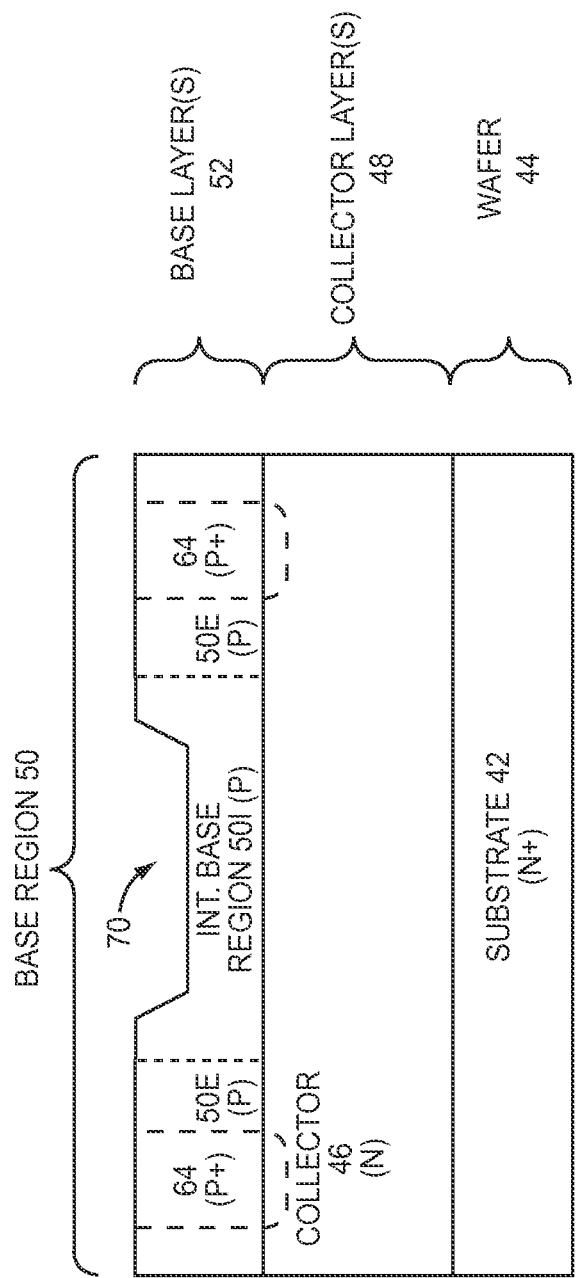
Figure 8E:
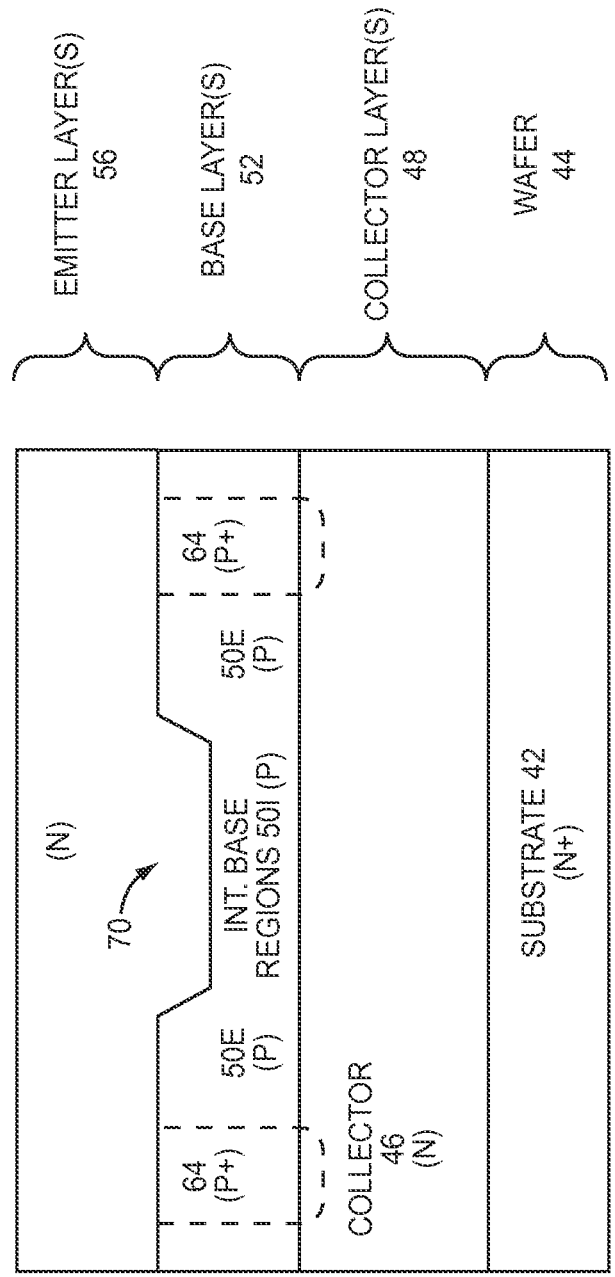
Figure 8F:
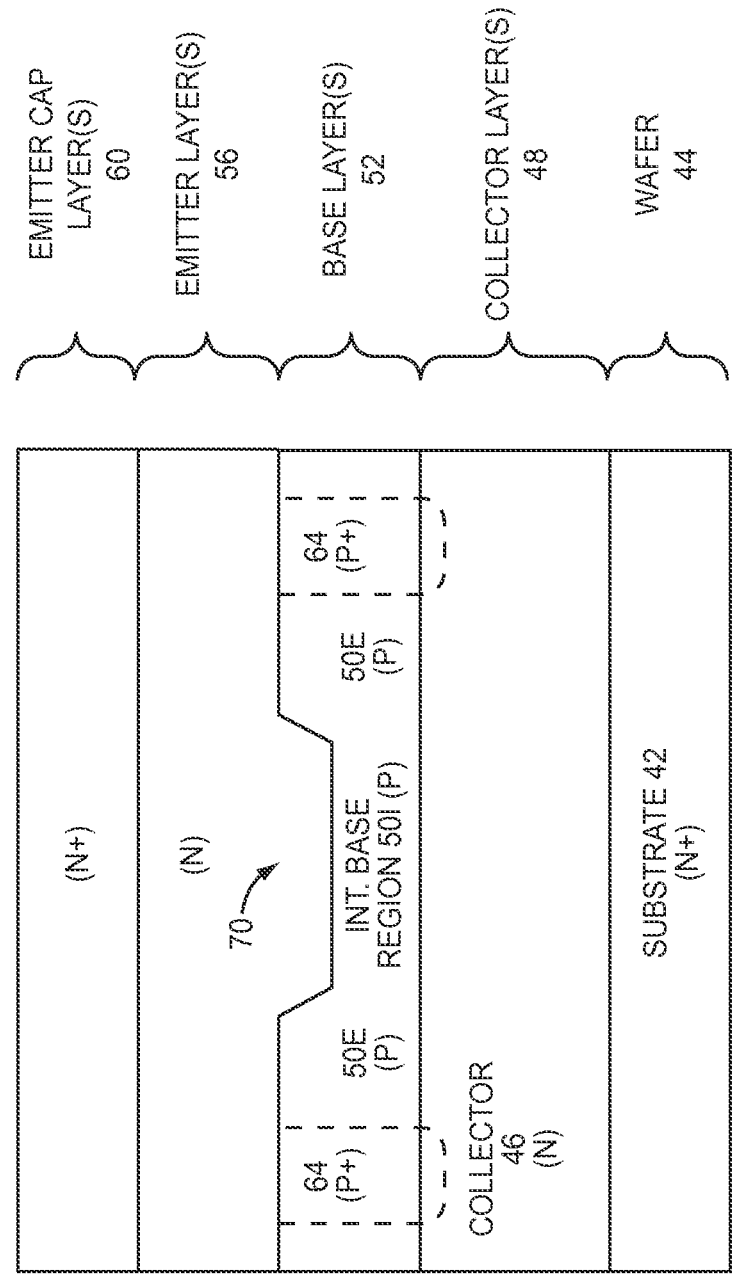

Since a recess 70 is employed in this embodiment, a selective etching process is used to etch a hole into the upper surface of the intrinsic base region 50I to form the recess 70 (FIG. 8D). The etching process may be controlled to achieve the desired angle for the sidewalls, assuming the sidewalls are not substantially vertical. Next, the one or more emitter layers 56 are formed over the upper surface of the base layers 52 that form the base region 50 and the recess 70 (FIG. 8E). The one or more emitter layers are moderately doped with an N-type dopant. The one or more emitter cap layers 60 are then formed over the upper surface of the one or more emitter layers 56 and are heavily doped with an N-type dopant (FIG. 8F).

Figure 8G:
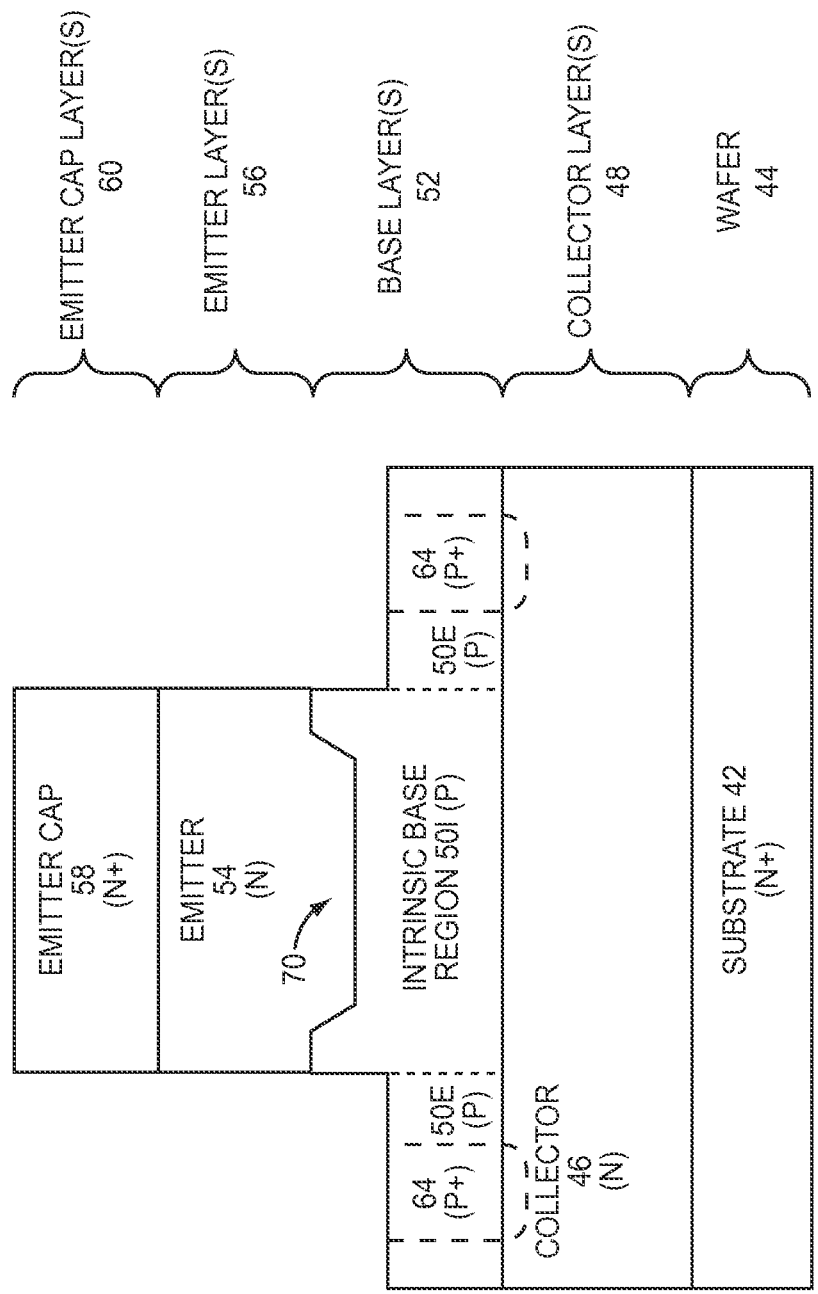

Next, the basic emitter structure, which includes the emitter 54 and the emitter cap 58, for the BJT 40 is formed by selectively etching away those portions of the one or more emitter and emitter cap layers 56 and 60 that do not form part of the emitter 54 or the emitter cap 58 (FIG. 8G). In this embodiment, upper portions of the extrinsic base regions 50E are also etched away, perhaps using the same etching step used to remove portions of the one or more emitter and emitter cap layers 56 and 60 to form the emitter structure. By over-etching into and thus removing the upper potions of the extrinsic base regions 50E in association with forming the emitter structure, the intrinsic base region 50I remains intact. As a result, the intrinsic base region 50I is thicker than the adjacent extrinsic base regions 50E, wherein the intrinsic base region 50I provides the elevated mesa on which the emitter structure is formed.

Figure 8H:
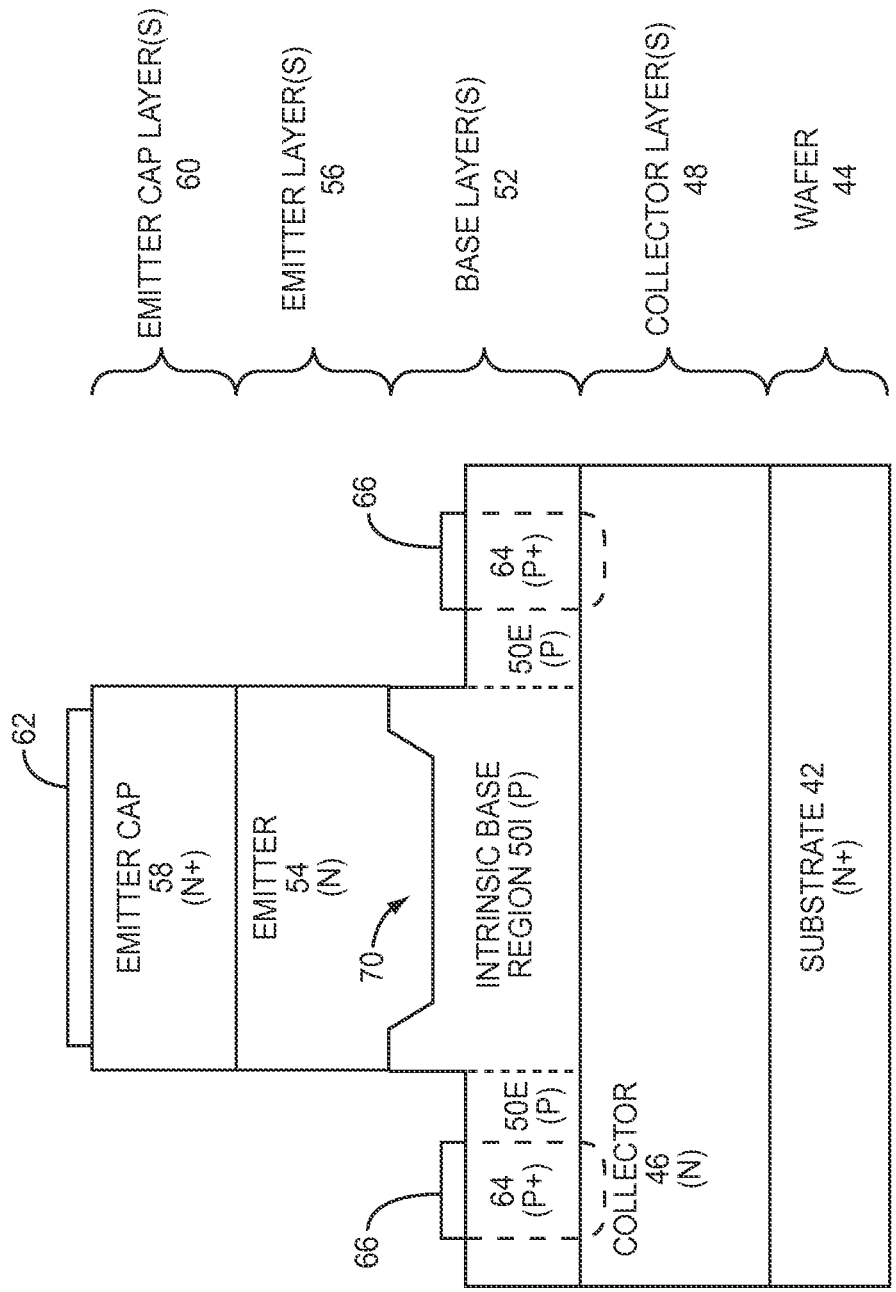
Figure 8I:
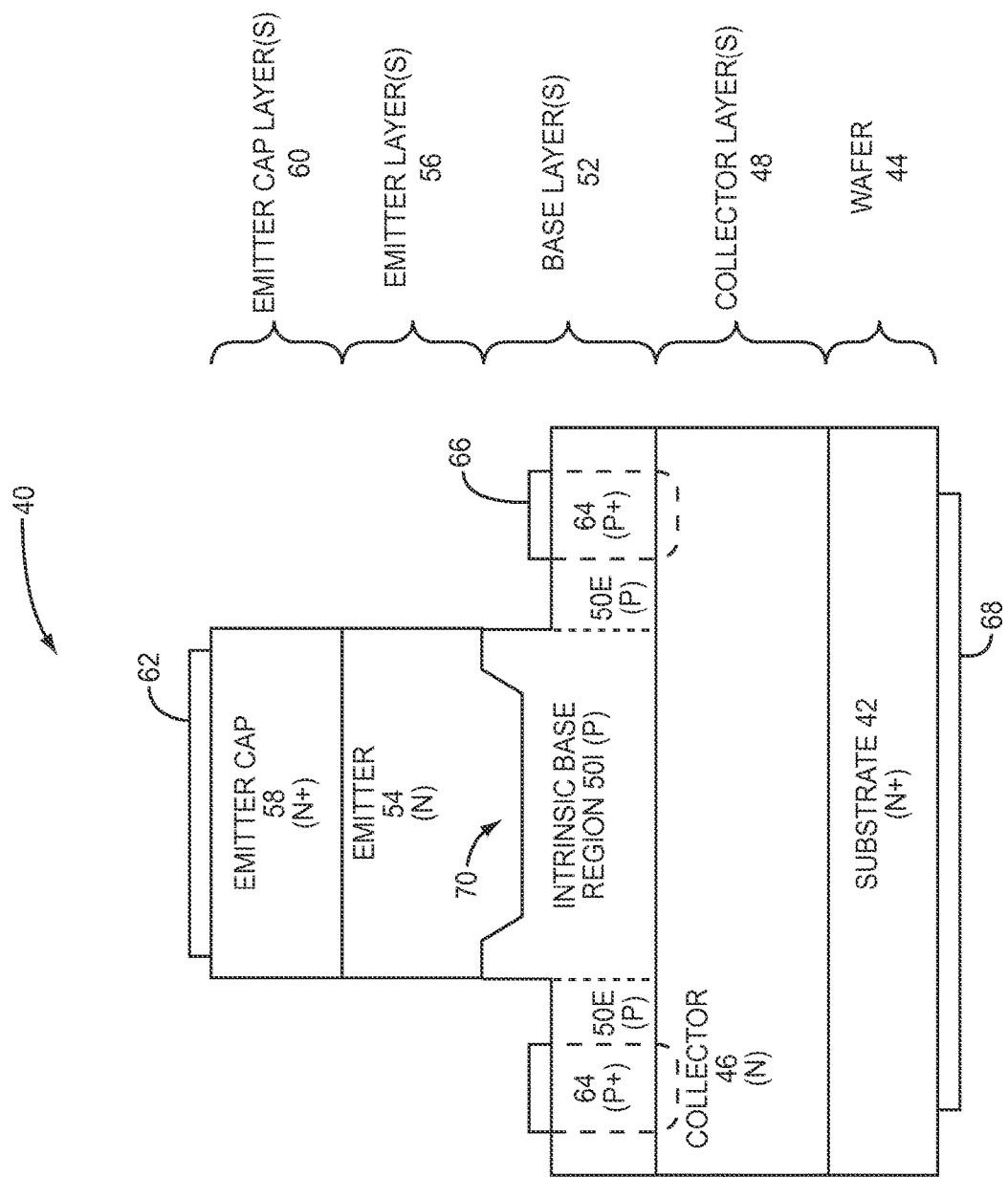

Once the emitter structure is formed, the emitter ohmic contact 62 and the base ohmic contacts 66 may be formed on the respective emitter cap 58 and the base cap regions 64 (FIG. 8H). Finally, the collector ohmic contact 68 is formed on the bottom surface of the substrate 42 (FIG. 8I). While the above fabrication process represents only one approach to the forming the BJT 40, other approaches are available as those skilled in the will appreciate upon reading this disclosure.

While the above description focuses on an NPN-type BJT 40, the concepts disclosed herein equally apply to a PNP-type BJT. For a PNP-type BJT, the polarity of the doping is reversed from that of the NPN-type BJT 40. Where an N-type dopant is used for the NPN-type BJT 40, a P-type dopant is used for the PNP-type BJT. Similarly, where a P-type dopant is used for the NPN-type BJT 40, an N-type dopant is used for the PNP-type BJT. The disclosed BJT structure that significantly reduces current crowding with respect to conventional BJTs provides the same benefit for both NPN-type and PNP-type BJTs.

Those skilled in the art will recognize improvements and modifications to the embodiments of the present disclosure. All such improvements and modifications are considered within the scope of the concepts disclosed herein and the claims that follow.

What is claimed is:

1. A bipolar junction transistor comprising:
   a collector;
   a base region formed over the collector such that a bottom surface of the base region contacts the collector, the base region comprising:
      an extrinsic base region;
      an intrinsic base region that extends above the extrinsic base region to provide a mesa, the mesa comprising a top surface opposite the collector; and
      a recess in the top surface of the mesa and comprising sidewalls that extend into the intrinsic base region to define a lateral boundary of the recess; and
   an emitter formed over the top surface of the mesa and in the recess such that the emitter contacts the sidewalls of the recess.

2. The bipolar junction transistor of claim 1 wherein the emitter is essentially only formed over the mesa such that essentially none of the emitter is formed over the extrinsic base region.

3. The bipolar junction transistor of claim 1 wherein the intrinsic base region is directly laterally adjacent to the extrinsic base region.

4. The bipolar junction transistor of claim 1 wherein the intrinsic base region comprises an upper portion and a lower portion residing below the upper portion, the upper portion is intentionally doped with a first dopant at a first concentration, and the lower portion is intentionally doped with the first dopant at a second concentration that is intentionally different than the first concentration.

5. The bipolar junction transistor of claim 4 wherein the first concentration is higher than the second concentration.

6. The bipolar junction transistor of claim 4 wherein the first concentration is at least two times higher than the second concentration.

7. The bipolar junction transistor of claim 4 wherein the first concentration is between about two and ten times higher than the second concentration.

8. The bipolar junction transistor of claim 4 wherein the first concentration is around about five times higher than the second concentration.

9. The bipolar junction transistor of claim 1 wherein the sidewalls are substantially vertical.

10. The bipolar junction transistor of claim 1 wherein the collector, the intrinsic base region, the extrinsic base region, and the emitter comprise silicon carbide.

11. The bipolar junction transistor of claim 1 further comprising a silicon carbide substrate over which the collector is formed.

12. The bipolar junction transistor of claim 1 further comprising at least one base cap region formed between at least one base ohmic contact and the extrinsic base region, an emitter cap region formed over the emitter, and an emitter ohmic contact formed over the emitter cap region.

13. The bipolar junction transistor of claim 1 wherein the intrinsic base region has a first nominal thickness, the extrinsic base region has a second nominal thickness, the mesa has a mesa thickness equal to a difference between the first nominal thickness and the second nominal thickness, and wherein the mesa thickness is at least ten percent of the first nominal thickness.

14. The bipolar junction transistor of claim 13 wherein the mesa thickness is between about ten percent and seventy percent of the first nominal thickness.

15. The bipolar junction transistor of claim 13 wherein the mesa thickness is between about twenty percent and seventy percent of the first nominal thickness.

16. The bipolar junction transistor of claim 13 wherein the mesa thickness is between about thirty percent and seventy percent of the first nominal thickness.

17. The bipolar junction transistor of claim 13 wherein the mesa thickness is between about forty percent and seventy percent of the first nominal thickness.

18. The bipolar junction transistor of claim 13 wherein the mesa thickness is between about thirty-five percent and sixty percent of the first nominal thickness.

19. A method for forming a bipolar junction transistor comprising:
   providing at least one collector layer for a collector;
   forming at least one base layer over the at least one collector layer to provide an intrinsic base region and an extrinsic base region;
   forming at least one emitter layer over the at least one base layer;
   etching through a portion of the at least one emitter layer and substantially into the extrinsic base region, such that the intrinsic base region extends above the extrinsic base region to provide a mesa on which an emitter from the at least one emitter layer is formed, wherein a top surface of the mesa has a recess comprising sidewalls that extend downward into the intrinsic base region to define a lateral boundary of the recess, and the emitter layer contacts the sidewalls of the recess.

20. The method of claim 19 wherein the emitter is essentially only formed over the mesa such that essentially none of the emitter is formed over the extrinsic base region.

21. The method of claim 19 wherein the intrinsic base region is directly laterally adjacent to the extrinsic base region.

22. The method of claim 19 wherein the intrinsic base region comprises an upper portion and a lower portion residing below the upper portion, the upper portion is intentionally doped with a first dopant at a first concentration, the lower portion is intentionally doped with the first dopant at a second concentration that is intentionally different than the first concentration.

23. The method of claim 22 wherein the first concentration is higher than the second concentration.

24. The method of claim 19 wherein the collector, the intrinsic base region, the extrinsic base region, and the emitter comprise silicon carbide.

25. The method of claim 19 wherein the intrinsic base region has a first nominal thickness, the extrinsic base region has a second nominal thickness, the mesa has a mesa thickness equal to a difference between the first nominal thickness and the second nominal thickness, and wherein the mesa thickness is at least ten percent of the first nominal thickness.

26. A bipolar junction transistor comprising:
a collector;
a base region formed over the collector and comprising an extrinsic base region and an intrinsic base region that extends above the extrinsic base region to provide a mesa, the intrinsic base region having a top surface including a recess with sidewalls that extend downward into the intrinsic base region, wherein the sidewalls are substantially angled relative to an epitaxial plane of the bipolar junction transistor; and
an emitter formed over the mesa such that the emitter contacts the sidewalls of the recess.

27. The bipolar junction transistor of claim 26 wherein the emitter is essentially only formed over the intrinsic base region such that essentially none of the emitter is formed over the extrinsic base region.

28. The bipolar junction transistor of claim 26 wherein the intrinsic base region is directly laterally adjacent to the extrinsic base region.

29. The bipolar junction transistor of claim 26 wherein the intrinsic base region comprises an upper portion and a lower portion residing below the upper portion, the upper portion is intentionally doped with a first dopant at a first concentration, and the lower portion is intentionally doped with the first dopant at a second concentration that is intentionally different than the first dopant concentration.

30. The bipolar junction transistor of claim 29 wherein the first concentration is higher than the second concentration.

31. The bipolar junction transistor of claim 29 wherein the first concentration is at least two times higher than the second concentration.

32. The bipolar junction transistor of claim 29 wherein the first concentration is between about two and ten times higher than the second concentration.

33. The bipolar junction transistor of claim 29 wherein the first concentration is around about five times higher than the second concentration.

34. The bipolar junction transistor of claim 26 wherein the sidewalls are obtusely angled relative to an epitaxial plane of the bipolar junction transistor.

35. The bipolar junction transistor of claim 26 wherein the intrinsic base region has a first nominal thickness, the extrinsic base region has a second nominal thickness, the mesa has a mesa thickness equal to a difference between the first nominal thickness and the second nominal thickness, and wherein the mesa thickness is at least ten percent of the first nominal thickness.

36. The bipolar junction transistor of claim 35 wherein the mesa thickness is between about ten percent and seventy percent of the first nominal thickness.

37. The bipolar junction transistor of claim 35 wherein the mesa thickness is between about twenty percent and seventy percent of the first nominal thickness.

38. The bipolar junction transistor of claim 35 wherein the mesa thickness is between about thirty percent and seventy percent of the first nominal thickness.

39. The bipolar junction transistor of claim 35 wherein the mesa thickness is between about forty percent and seventy percent of the first nominal thickness.

40. The bipolar junction transistor of claim 35 wherein the mesa thickness is between about thirty-five percent and sixty percent of the first nominal thickness.

* * * * *

UNITED STATES PATENT AND TRADEMARK OFFICE
CERTIFICATE OF CORRECTION

PATENT NO. : 9,755,018 B2
APPLICATION NO. : 13/323297
DATED : September 5, 2017
INVENTOR(S) : Lin Cheng, Anant K. Agarwal and Sei-Hyung Ryu It is certified that error appears in the above-identified patent and that said Letters Patent is hereby corrected as shown below:

In the Specification

In Column 5, Line 48, replace "$t_1$" with --$t_I$--.

In Column 5, Line 50, replace "$t_m \cong t_1-t_E$" with --$t_m \cong t_I-t_E$--.

In Column 5, Line 53, replace "$t_1$, wherein $t_m \geq 0.1*t_1$" with --$t_I$, wherein $t_m \geq 0.1*t_I$--.

In Column 5, Line 55, replace "$t_1$" with --$t_I$--.

In Column 5, Line 56, replace "$0.1*t_1 \leq t_m \leq 0.7*t_1$" with --$0.1*t_I \leq t_m \leq 0.7*t_I$--.

In Column 5, Line 59, replace "$t_1$, wherein approximately $0.2*t_1 \leq t_m \leq 0.7*t_1$" with --$t_I$, wherein approximately $0.2*t_I \leq t_m \leq 0.7*t_I$--.

In Column 5, Line 62, replace "$t_1$" with --$t_I$--.

In Column 5, Line 63, replace "$t_1 \leq t_m \leq 0.7*t_1$" with --$t_I \leq t_m \leq 0.7*t_I$--.

In Column 5, Line 65, replace "$t_1$" with --$t_I$--.

In Column 5, Line 66, replace "$0.2*t_1 \leq t_m \leq 0.7*t_1$" with --$0.2*t_I \leq t_m \leq 0.7*t_I$--.

In Column 6, Line 2, replace "$t_1$, wherein approximately $0.3*t_1 \leq t_m \leq 0.7*t_1$" with --$t_I$, wherein approximately $0.3*t_I \leq t_m \leq 0.7*t_I$--.

In Column 6, Line 5, replace "$t_1$, wherein approximately $0.3*t_1 \leq t_m \leq 0.7*t_1$" with --$t_I$, wherein approximately $0.3*t_I \leq t_m \leq 0.7*t_I$--.

Signed and Sealed this
Twenty-fourth Day of October, 2017

Joseph Matal
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 9,755,018 B2

In Column 6, Line 8, replace "$t_1$, wherein $t_m \cong 0.5*t_1$" with --$t_I$, wherein $t_m \cong 0.5*t_I$--.

In Column 6, Lines 11 and 12, replace "$t_1$, wherein $t_m \cong 0.7*t_1$" with --$t_I$, wherein $t_m \cong 0.7*t_I$--.

In Column 6, Line 14, replace "wherein $0.35*t_1 \leq t_m \leq 0.6*t_1$" with --wherein $0.35*t_I \leq t_m \leq 0.6*t_I$--.

In Column 7, Line 16, replace "$t_1$" with --$t_I$--.

In Column 8, Line 1, replace "$t_1$" with --$t_I$--.